(12) United States Patent
Nishio et al.

(10) Patent No.: US 7,268,659 B2
(45) Date of Patent: Sep. 11, 2007

(54) MICRO ELECTRIC POWER CONVERTER

(75) Inventors: Haruhiko Nishio, Matsumoto (JP); Yasushi Katayama, Kawasaki (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 60 days.

(21) Appl. No.: 11/339,550

(22) Filed: Jan. 26, 2006

(65) Prior Publication Data
US 2006/0227518 A1    Oct. 12, 2006

(30) Foreign Application Priority Data
Mar. 30, 2005    (JP) .............................. 2005-097212

(51) Int. Cl.
*H01F 5/00* (2006.01)
(52) U.S. Cl. ...................... 336/200; 336/192
(58) Field of Classification Search .................. 336/65, 336/83, 192, 200, 232; 257/531; 363/147
See application file for complete search history.

(56) References Cited

U.S. PATENT DOCUMENTS 6,930,584 B2 * 8/2005 Edo et al. .................. 336/200
2004/0179383 A1 * 9/2004 Edo et al. .................. 363/111

FOREIGN PATENT DOCUMENTS

| JP | 2004-072815 | 3/2004 |
|----|-------------|--------|
| JP | 2004-274004 | 9/2004 |

* cited by examiner

Primary Examiner—Tuyen T. Nguyen
(74) Attorney, Agent, or Firm—Manabu Kanesaka

(57) ABSTRACT

A thin film magnetic induction element includes a ferrite substrate, a coil provided across the ferrite substrate and including connection conductors and coil conductors, and terminals provided on perimeter portions of the substrate. Terminals capable of being adversely affected by an induced magnetic flux, such as a VDD terminal, a CGND terminal, an IN terminal, a PVDD terminal, a PGND terminal, an FB terminal, a CE terminal, and an AL terminal are arranged along the Y-direction of the substrate, in which the magnetic flux density is low. Terminals substantially incapable of being adversely affected by an induced magnetic flux are arranged along the X-direction of the substrate, in which the magnetic flux density is high. A micro electric power converter having the thin film magnetic induction element is less susceptible to circuit malfunctions.

6 Claims, 6 Drawing Sheets

MICRO ELECTRIC POWER CONVERTER

BACKGROUND OF THE INVENTION AND RELATED ART STATEMENT

The present invention relates to a micro DC-DC converter and to such a micro electric power converter formed of a semiconductor integrated circuit (hereinafter referred to as an "IC") and passive component parts such as a coil, a capacitor, and a resistor.

Recently, the popularity of hand held devices has become widespread. Many of the hand held devices use a cell for the electric power source thereof, and incorporate a DC-DC converter and such an electric power converter therein. Usually, the electric power converter, including active devices such as switching devices and a control IC, and passive individual component parts such as a coil, a transformer, a rectifier, a capacitor, and a resistor, is configured as a hybrid module, and is mounted on a printed circuit board such as a ceramic board and a plastic board.

FIG. 4 is a block circuit diagram of a conventional DC-DC converter. In FIG. 4, the conventional DC-DC converter circuit on a printed circuit board 61 is enclosed by the outermost dotted frame.

Referring now to FIG. 4, the DC-DC converter includes an input capacitor Ci, an output capacitor Co, a thin film magnetic induction element (thin film inductor) L, a control circuit 64, MOSFETs 66, and a driver 65 for driving MOSFETs 66. An electric power supply IC, including control circuit 64, MOSFETs 66, and driver 65 for driving MOSFETs 66, is formed in a semiconductor chip 63. Thin film magnetic induction element L is formed on a ferrite substrate 62. Semiconductor chip 63 is fixed onto ferrite substrate 62 via stud bumps (not shown). Input capacitor Ci, output capacitor Co, and ferrite substrate 62 are mounted on printed circuit board 61.

As a DC input voltage Vi is inputted to the DC-DC converter, driver 65 switches on and off MOSFETs 66 with the signal therefrom, and the DC-DC converter outputs a predetermined DC output voltage Vo. Thin film induction element L and output capacitor Co constitute a filter circuit for outputting the DC voltage Vo.

FIG. 5 is a detailed block circuit diagram of FIG. 4. Referring now to FIG. 5, control circuit 64 includes a UVLO circuit 71 that stops the DC-DC converter when the power supply voltage is low; an oscillator circuit (hereinafter referred to as an "OSC circuit") 72 that transmits a triangular wave or a sawtooth wave to a PWM comparator 74, which transmits a signal to driver circuit 65; a reference voltage circuit (hereinafter referred to as a "Vref circuit") 73; a timer latch circuit 75 that stops the DC-DC converter when an over voltage is caused; an error amplifying circuit (hereinafter referred to as an "ErrAmp circuit") 76 for keeping a certain output voltage; a CR circuit formed of a capacitor CPC, and a resistor RPC; a resistance circuit, formed of resistors RFBO and RFBI, that feeds back the output voltage; and a level shift and enable control circuit (hereinafter referred to simply as a "logic circuit") 77 that controls level shift and circuit interruption.

In control circuit 64, the signal from PWM comparator 74 is received by driver circuit 65. MOSFETs 66 are switched on and off with the signal from driver circuit 65. And, the output from MOSFETs 66 is outputted from a terminal OUT (an OUT terminal).

The DC-DC converter is mounted on printed circuit board 61. In FIG. 5, among the terminals for exchanging signals between semiconductor chip 63 and printed circuit board 61, a CE terminal is an input terminal for inputting digital signals to logic circuit 77 and an AL terminal is an output terminal for outputting digital signals from logic circuit 77. Among the terminals for exchanging signals, a control power supply terminal VDD (a VDD terminal), a control signal ground terminal CGND (a CGND terminal), an output terminal FB (an FB terminal) for ErrAmp circuit 76, an input terminal IN (an IN terminal) for ErrAmp circuit 76, a power ground terminal PGND (a PGND terminal), output terminals OUT (a first OUT terminal and a second OUT terminal), and a power supply terminal PVDD (a PVDD terminal) for power feed are analog signal terminals. (In the drawing figures, the word "terminal" is not used for the reference symbols.)

The terminals described above are arranged on the perimeter portion of ferrite substrate 62. The signals from printed circuit board 61 are transmitted to control circuit 64 formed in semiconductor chip 63 via the terminals formed on ferrite substrate 62.

As the demand for reducing the size and weight of the various hand held devices increases, there is also a strong demand to reduce the size of the electric power converters incorporated in the hand held devices. Downsizing of the hybrid power supply module is promoted by the advancements in the multi-chips-module (MCM) technology and the laminate ceramic component parts technology. However, since these technologies mount discrete component parts on a base board, it is limited to narrowing the mounting area for the power supply module. Especially, since the magnetic induction component parts such as inductors and transformers are much more bulky than the integrated circuit, the magnetic induction parts represent the greatest challenge for down-sizing the hand held devices.

Recently, planar-type thin film magnetic induction elements (solenoids), which meet the demands for reducing the size of the thin film magnetic component parts, have been reported. See, e.g., JP 2004-274004 A (and its FIG. 1) and JP 2004-72815 A (and its FIG. 3). Each of the thin film magnetic induction elements reported is almost the same in size as a semiconductor chip, and is mounted on the semiconductor chip. The techniques described in JP 2004-274004 A and JP 2004-72815 A facilitate thinning the magnetic induction elements and reducing the mounting area thereof. The thin film magnetic induction element (solenoid) disclosed in JP 2004-274004 A will be described below.

FIG. 6 is a top plan view of a conventional thin film magnetic induction element. The conventional thin film magnetic induction element is formed of ferrite substrate 62; coil conductors 3, 4, and 5 constituting a solenoid coil formed across ferrite substrate 62; first OUT terminal (terminal 21) connected to coil conductor 4; second OUT terminal (terminal 22) connected to coil conductor 4; and terminals 51 through 60 formed in the perimeter portion of ferrite substrate 62. Terminals 51 through 60 are allotted at random to the terminals for exchanging signals between printed circuit board 61 and semiconductor chip 63. In detail, terminal 57 is allotted to VDD terminal, terminal 58 to CGND terminal, terminal 54 to FB terminal, terminal 55 to IN terminal, terminal 56 to PGND terminal, terminal 60 to PVDD terminal, terminal 53 to PGND terminal, terminal 52 to CE terminal, and terminal 51 to AL terminal. Via these terminals, signals are exchanged between printed circuit board 61 and control circuit 64 formed in semiconductor chip 63.

JP 2004-72815 A discloses a thin film magnetic induction element formed of a toroidal solenoid coil. The thin film magnetic induction element disclosed in JP 2004-72815 A facilitates narrowing the mounting area and improving the electric power conversion efficiency.

The planar magnetic flux density distribution in the ferrite substrate of the thin film magnetic induction element shown in FIG. 6 is simulated. The simulation conditions include the area of ferrite substrate 62, the thickness of ferrite substrate 62, and a current I made to flow through a coil. The area of ferrite substrate 62 is set at 3.5 mm□. The thickness of ferrite substrate 62 is set at 525 μm. The current I is set at 300 mA.

Although the simulated magnetic flux density distribution is not illustrated, the areas where the magnetic flux density is high, and the areas where the magnetic flux density is low, are indicated in FIG. 7. The simulation results indicate that the magnetic flux density is high in the areas A extending in the longitudinal direction of the coil (X-direction) and the magnetic flux density is low in the areas B extending in perpendicular to the longitudinal direction of the coil (Y-direction). The magnetic flux density is high in the areas A extending in the longitudinal direction of the coil presumably because the magnetic flux components flowing through the gaps between adjacent conductors 3 to ferrite substrate 62 outside the coil are added to the magnetic flux flowing through the inside of the coil and, then, to ferrite substrate 62 outside the coil.

A voltage is induced in terminals 21, 22, 51 through 60 crossing the magnetic flux by the mutual inductance. Since the induced voltages are superimposed onto the signal as noises, large noises are caused in terminals 21, 22, 51 through 60 in the areas A, where the magnetic flux density is high. The large noises further cause a malfunction of the circuit. Circuit malfunction is more likely to be caused when the noises are superimposed onto an analog signal than when the noises are superimposed onto a digital signal. Especially when the noises are superimposed on a VDD terminal, a CGND terminal, and an IN terminal, circuit malfunction very often results.

In the conventional thin film magnetic induction element, the VDD terminal, the CGND terminal, the IN terminal for inputting the control input signal and such analog signals, the CE terminal for digital signal input, and the AL terminal for digital signal output are arranged at random on the perimeter portion of ferrite substrate 62. Circuit malfunctions are caused by positioning the terminals most adversely affected by the noises, such as the VDD terminal, the CGND terminal, and the IN terminal in the areas A, where the magnetic flux density is high.

In FIG. 7, the VDD terminal and the CGND terminal are allotted respectively to terminals 57 and 58, where the magnetic flux density is high, thereby causing circuit malfunctions due to the noise. Especially when ferrite substrate 62 is small, or the current made to flow through the coil is high, the magnetic flux density is high, thereby causing circuit malfunctions.

In view of the foregoing, it would be desirable to obviate the problems described above. It would also be desirable to provide a micro electric power converter that causes hardly any circuit malfunction.

Further objects and advantages of the invention will be apparent from the following description of the invention and the associated drawings.

SUMMARY OF THE INVENTION

According to a first embodiment of the invention, there is provided a micro electric power converter including a magnetic insulator substrate; a coil shaped with a solenoid and formed across the central portion of the magnetic insulator substrate; first terminals and second terminals formed on the perimeter portions of the magnetic insulator substrate; a semiconductor chip including circuits connected to the first terminals and the second terminals; and passive component parts.

The direction perpendicular to the cross section of the coil is designated as the X-direction, in which the density of the magnetic flux generated by making a current flow through the coil is high. The direction perpendicular to the X-direction is designated to be the Y-direction, in which the density of the magnetic flux generated by making the current flow through the coil is low.

The first terminals, through which are transmitted signals easily causing any circuit malfunction under the influence of the voltages induced by the magnetic flux, are arranged along the Y-direction. The second terminals, through which are transmitted signals hardly causing any circuit malfunction even under the influence of the voltages induced by the magnetic flux, are arranged along the X-direction.

Advantageously, the magnetic insulator substrate is a ferrite substrate.

Also advantageously, the voltages of the signals transmitted through the first terminals are the power supply voltage of a control circuit, the ground voltage of the control circuit, and the voltages of the analog signals inputted to and outputted from the control circuit, which can easily cause any circuit malfunction.

And, the voltages of the signals transmitted through the second terminals are digital signal voltages which cause hardly any circuit malfunction.

According to a second embodiment of the invention, there is provided a micro electric power converter including a magnetic insulator substrate; a coil shaped with a solenoid and formed across the central portion of the magnetic insulator substrate; first terminals and second terminals formed on the perimeter portions of the magnetic insulator substrate; a semiconductor chip including circuits connected to the first terminals and the second terminals; and a printed circuit board connected to the first terminals and the second terminals formed on the perimeter portions of the magnetic insulator substrate, the printed circuit board mounting passive component parts thereon.

The direction perpendicular to the cross section of the coil is designated to be the X-direction, in which the density of the magnetic flux generated by making a current flow through the coil is high. The direction perpendicular to the X-direction is designated to be the Y-direction, in which the density of the magnetic flux generated by making the current flow through the coil is low.

The first terminals, in which the impedance seen therefrom in the direction of the semiconductor chip is higher than the impedance seen therefrom to the direction of the printed circuit board, are arranged along the Y-direction. The second terminals, in which the impedance seen therefrom to the direction of the semiconductor chip is lower than the impedance seen therefrom to the direction of the printed circuit board, are arranged along the X-direction.

According to the first embodiment of the invention, a circuit malfunction is prevented from arising by arranging the terminals along the Y-direction, where the magnetic flux density may be lowered.

According to the second embodiment of the invention, a circuit malfunction is prevented from arising by arranging the terminals, through which the signals most adversely affected by the induced voltages are transmitted, along the Y-direction, where the magnetic flux may be lowered, and by arranging the terminals through which the signals least affected by the induced voltage are transmitted, along the X-direction, where the magnetic flux density is high.

DETAILED DESCRIPTION OF THE PREFERRED EMBODIMENTS

Now the present invention will be described in detail hereinafter with reference to the accompanying drawing figures which illustrate the preferred embodiments of the invention.

Figure 1:
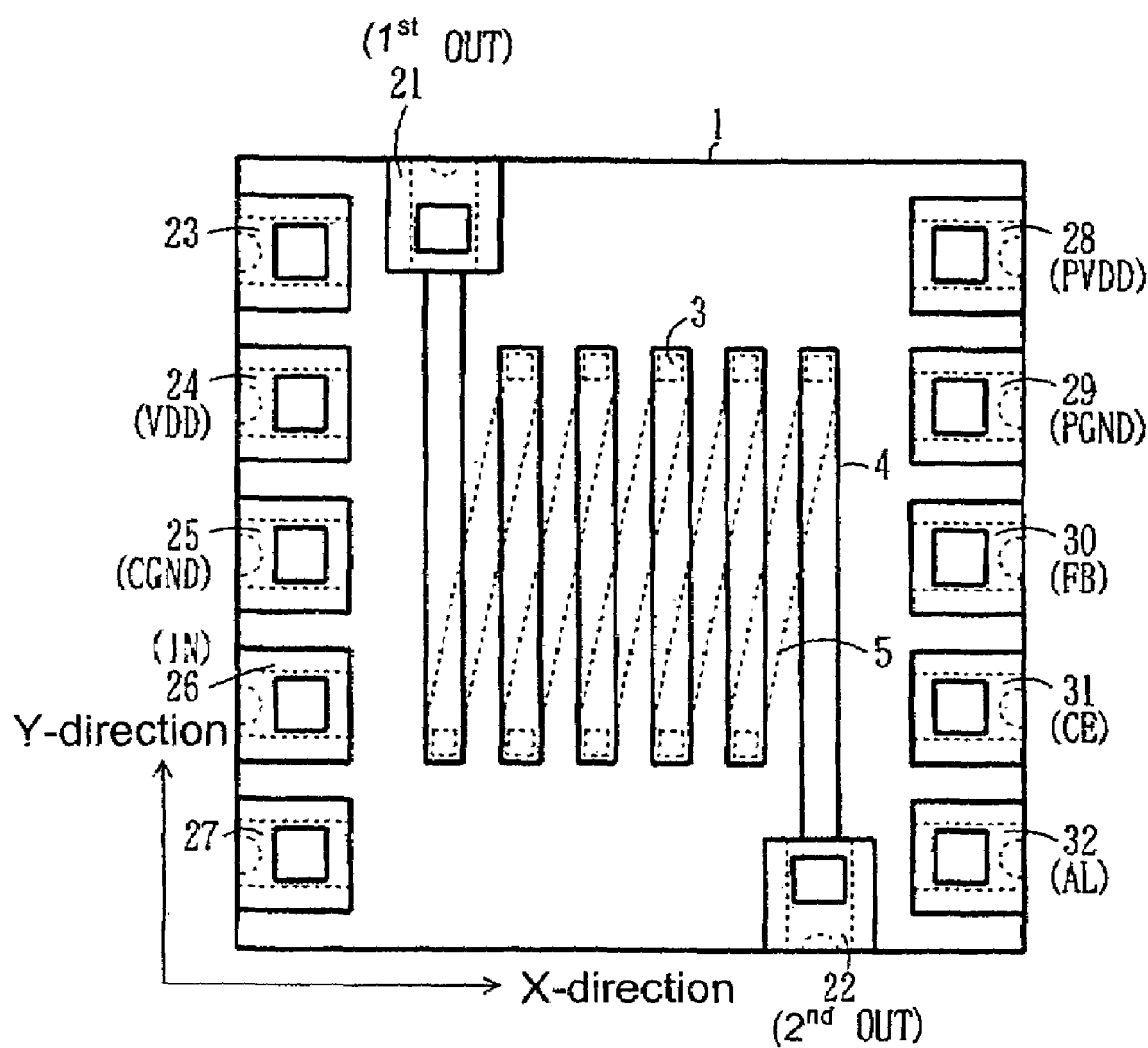
FIG. 1 is a top plan view of a micro electric power converter according to a first embodiment of the invention.
Figure 6:
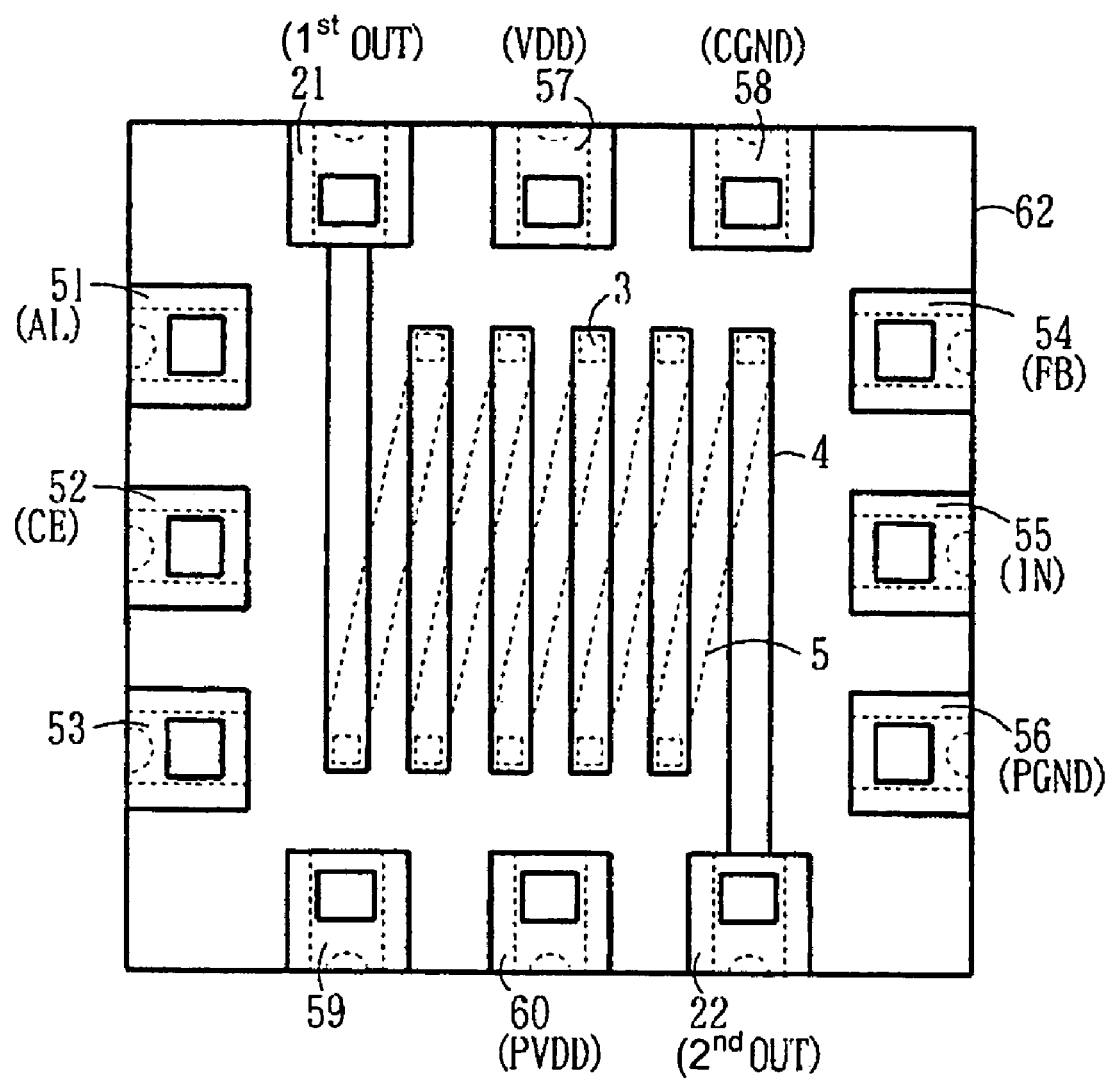
FIG. 6 is a top plan view of a conventional thin film magnetic induction element.
Figure 7:
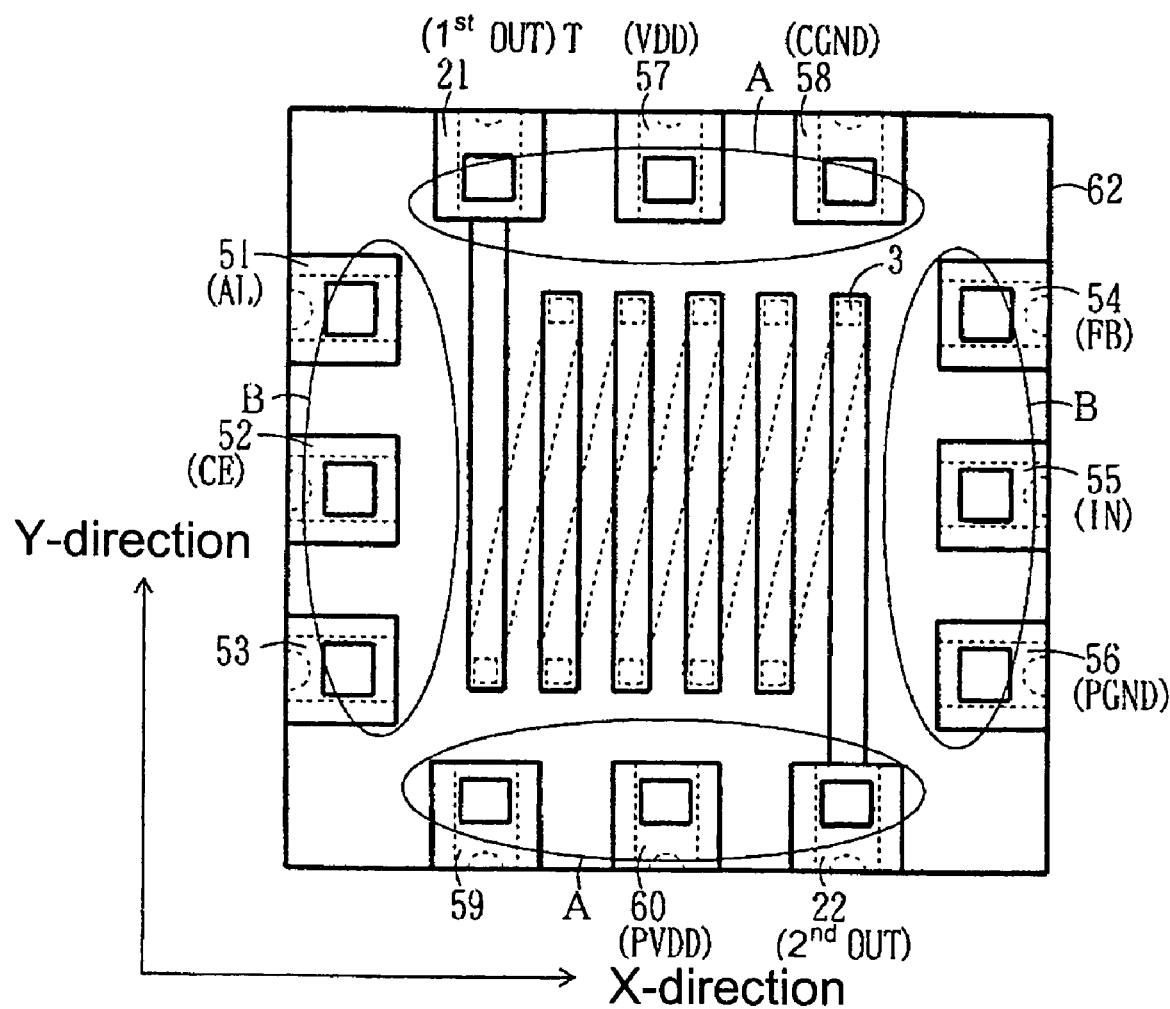
FIG. 7 is a top plan view of the conventional thin film magnetic induction element illustrating the areas where the magnetic flux density is high, and the areas where the magnetic flux density is low.

FIG. 1 is a top plan view of a thin film magnetic induction element constituting a micro electric power converter according to a first embodiment of the invention. In FIG. 1, the direction perpendicular to the cross section of a solenoid coil (the axial direction of the coil) is designated to be the X-direction, and the direction perpendicular to the X-direction is designated to be the Y-direction. In FIG. 1, the same reference numbers and symbols as used in FIG. 6 are used to designate the same constituent elements.

Referring now to FIG. 1, the thin film magnetic induction element according to the first embodiment includes a ferrite substrate 1; a coil formed across ferrite substrate 1 and including connection conductors 3 and coil conductors 4 and 5; and terminals 21 through 32 formed on the perimeter portions of ferrite substrate 1. Terminals 23 through 32 are arranged along the Y-direction, in which the magnetic flux density is low.

Since a first OUT terminal and a second OUT terminal, both connected to coil conductor 4, are hardly affected at all by the magnetic flux, first OUT terminal and second OUT terminal are allotted to terminals 21 and 22, at which the magnetic flux density is high, respectively. The VDD terminal, CGND terminal, and IN terminal are allotted to terminals 24, 25, and 26, at which the magnetic flux density is low. The PVDD terminal, PGND terminal, FB terminal, CE terminal, and AL terminal are allotted to terminals 28, 29, 30, 31, and 32, at which the magnetic flux density is low.

By arranging first and second OUT terminals along the X-direction and by arranging all the other terminals along the Y-direction, circuit malfunction caused by the voltages induced by the magnetic flux (induced voltages: noises) is prevented from occurring.

In other words, by arranging all the other terminals than the coil terminals (first and second OUT terminals) along the Y-direction, in which the magnetic flux density may be lowered, any circuit malfunction hardly arises.

If there remains available space in the Y-direction, the coil terminals (first and second OUT terminals) may be arranged along the Y-direction with no associated problem.

Figure 2:
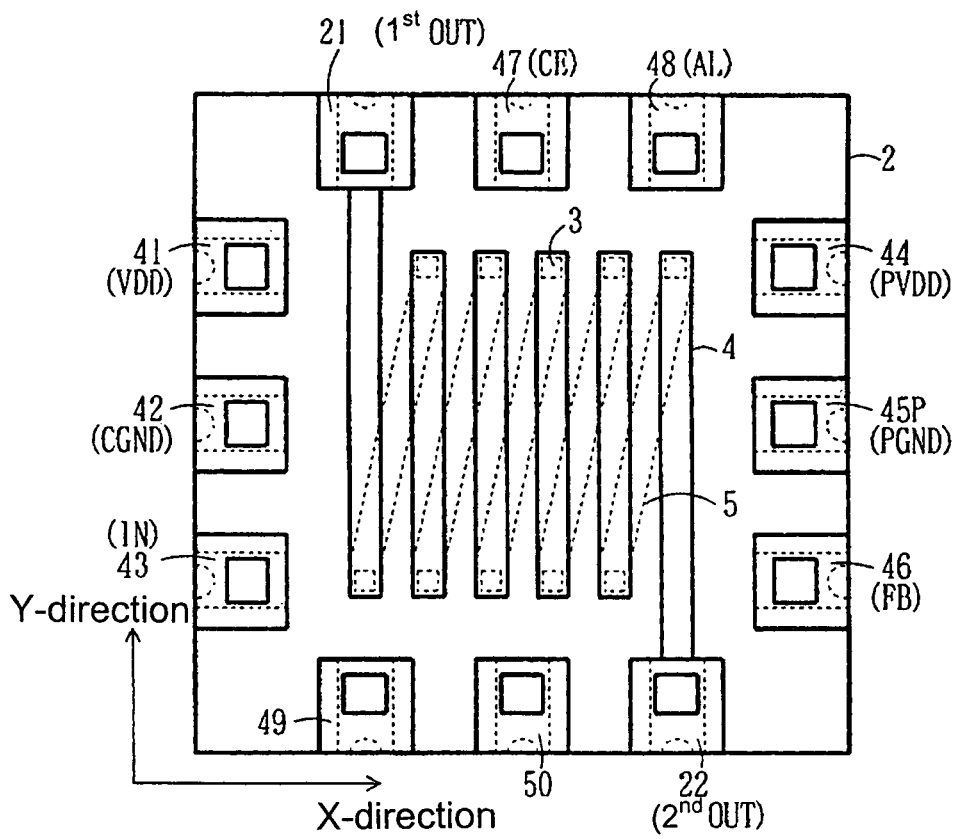
FIG. 2 is a top plan view of a micro electric power converter according to a second embodiment of the invention.

FIG. 2 is a top plan view of a thin film magnetic induction element constituting a micro electric power converter according to a second embodiment of the invention. In FIG. 2, the axial direction of a solenoid coil is designated to be the X-direction, and the direction perpendicular to the X-direction is designated to be the Y-direction. In FIG. 2, the same reference numbers and symbols as used in FIG. 6 are used to designate the same constituent elements.

Referring now to FIG. 2, the thin film magnetic induction element according to the second embodiment includes a ferrite substrate 2; a coil formed across ferrite substrate 2 and including connection conductors 3 and coil conductors 4 and 5; and terminals 21, 22, 41 through 50 formed on the perimeter portions of ferrite substrate 2. Terminals 41 through 46 are arranged along the Y-direction, in which the magnetic flux density is low. Terminals 21, 22, 47, 48, 49, and 50 are arranged along the X-direction, in which the magnetic flux density is high.

The VDD terminal, the CGDN terminal, and the IN terminal, each of which is easily affected by the magnetic flux, are allotted to terminals 41, 42, and 43, at which the magnetic flux density is low. The first and second OUT terminals, both hardly affected by the magnetic flux, are allotted to terminals 21 and 22. The CE terminal and AL terminal, both hardly affected by the magnetic flux, are allotted to terminals 47 and 48.

In FIG. 2, the PVDD terminal, the PGND terminal, and the FB terminal, each of which is hardly affected by the magnetic flux, are allotted to terminals 44, 45, and 46. Any of the terminals hardly affected by the magnetic flux may be allotted to terminal 49 or 50, at which the magnetic flux density is high, with no associated problem.

Thus, by arranging the VDD terminal, the CGND terminal, and the IN terminal, each of which is easily affected by the magnetic flux, along the Y-direction, circuit malfunction caused by voltages induced by the magnetic flux (induced voltages: noises) is prevented from occurring.

In other words, the VDD terminal, the CGND terminal, the IN terminal, and the FB terminal, through which the signals most easily adversely affected by the magnetic flux are transmitted, may be arranged at least along the Y-direction with no associated problem.

The CE terminal and the AL terminal, through which the signals least affected by the magnetic flux are transmitted, may be arranged at least along the X-direction with no associated problem.

And, all the other terminals may be arranged along the X- and Y-directions with no associated problem. Here, the signals affected most adversely by the magnetic flux are analog signals including the power supply voltage for the control circuit (power supply voltage signal), the GND potential for the power supply to the control circuit (ground potential signal), and the input and output signals of the error amplifier circuit (ErrAmp circuit) constituting the control circuit. The signals least affected by the magnetic flux include the digital signals transmitted through the CE terminal and AL terminal, the main circuit power supply voltage inputted to the PVDD terminal, and the ground potential of the main circuit power supply inputted to the PGND terminal.

By arranging the terminals through which the signals most adversely affected by the induced voltages are transmitted along the Y-direction, in which the magnetic flux density may be lowered, and by arranging the terminals through which the signals least affected by the induced voltage are transmitted along the X-direction, in which the magnetic flux density is high, circuit malfunction caused by induced voltages is prevented from occurring. The terminals through which the signals that are hardly affected by the induced voltage are transmitted may be arranged along the Y-direction, in which the magnetic flux density is low, with no associated problem.

Figure 3:
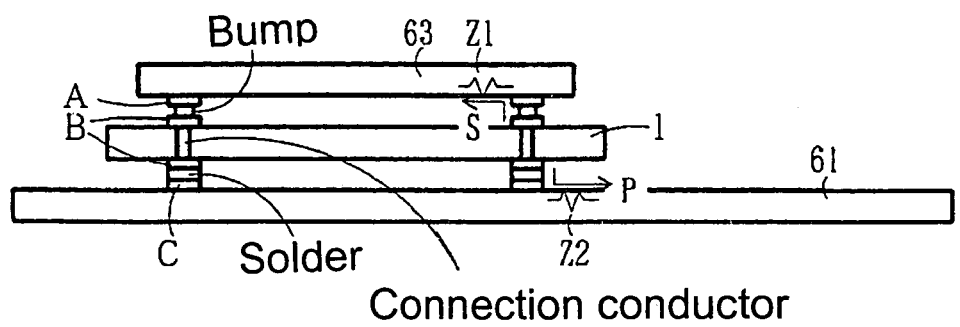
FIG. 3 is a cross-sectional view of a micro electric power converter according to a third embodiment of the invention.
Figure 4:
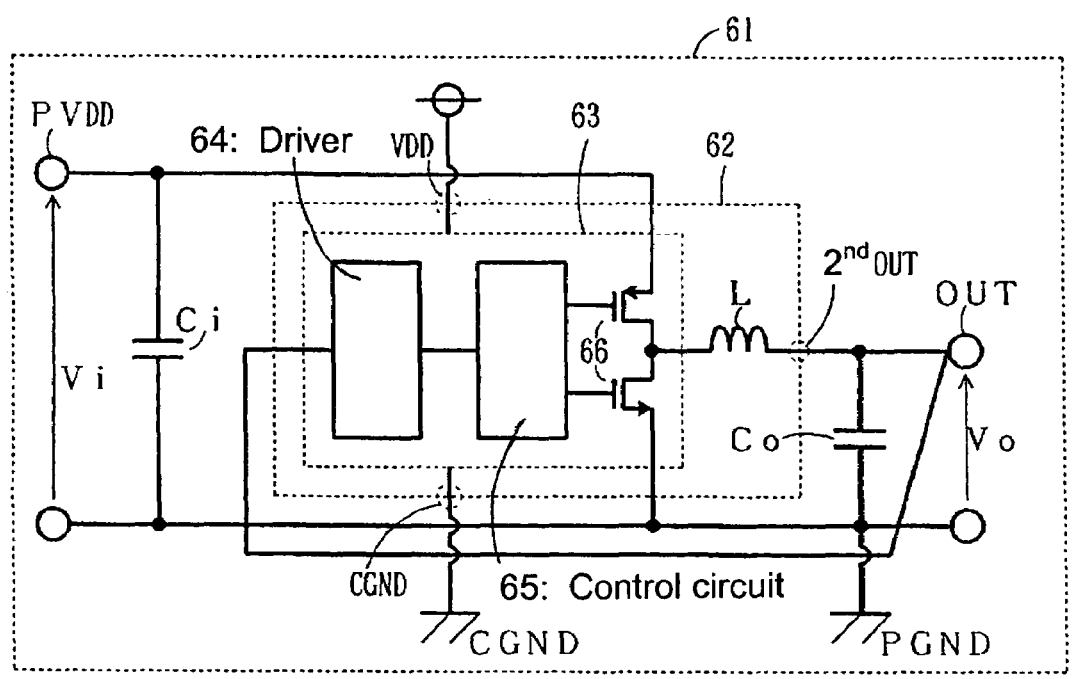
FIG. 4 is a block circuit diagram of a conventional DC-DC converter.
Figure 5:
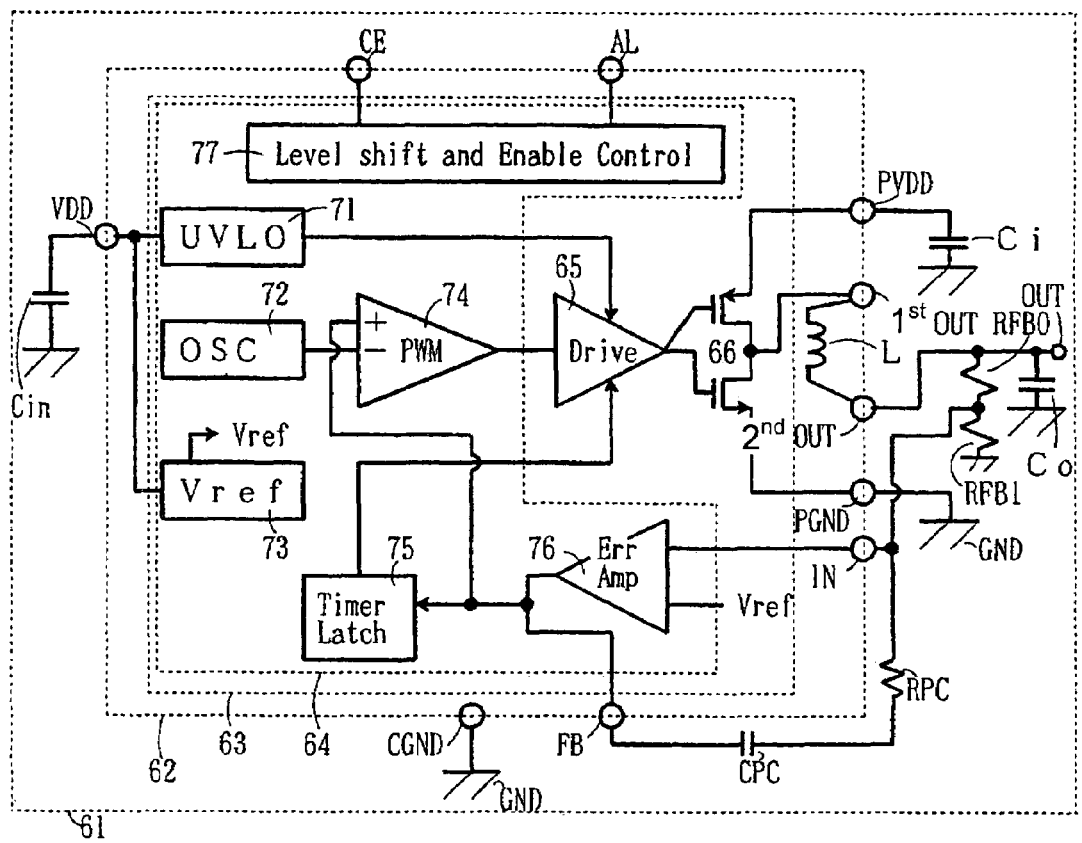
FIG. 5 is a detailed block circuit diagram of FIG. 4.

FIG. 3 is a cross-sectional view of a micro electric power converter according to a third embodiment of the invention. Referring now to FIG. 3, terminals B (e.g. terminals 21 through 32 in FIG. 1) formed on the upper surface of thin film magnetic induction element L (including ferrite substrate 1) are fixed to terminals A formed on semiconductor chip 63 shown in FIGS. 4 and 5.

Terminals B (e.g. terminals 21 through 32 in FIG. 1) formed on the lower surface of thin film magnetic induction element L are connected to terminals C formed on printed circuit board 61. Terminals 21 through 32 shown in FIG. 1 are formed on the front and back surface sides of ferrite substrate 1. The terminals formed on both surface sides of ferrite substrate 1 and designated by the same reference number are connected electrically to each other with a connection conductor extended through ferrite substrate 1.

Terminals A formed on semiconductor chip 63 are connected to control circuit 64 and such a circuit formed in semiconductor chip 63. Terminals C formed on printed circuit board 61 are connected to the capacitors (e.g. capacitor CPC), the resistors (e.g. resistors RFBO and PFBI), and such circuit constituent parts mounted on printed circuit board 61.

When the impedance Z1 seen from terminals B on ferrite substrate 1 in the direction S of semiconductor chip 63 is higher than the impedance Z2 seen from the terminals B in the direction P of printed circuit board 61, the terminals B (e.g. VDD terminal and FB terminal) are arranged along the Y-direction. When the impedance Z1 seen from terminals B on ferrite substrate 1 in the direction S of semiconductor chip 63 is lower than the impedance Z2 seen from the terminals B in the direction P of printed circuit board 61, the terminals B are arranged along the X-direction.

By arranging the terminals B as described above, circuit malfunction arising from noises is prevented from occurring. This is because the input for the active device is affected more adversely by the noises than the input for the passive element. Usually, the input impedance of the active device is high. Since all the active devices are included in semiconductor chip 63, the arrangements of the terminals of the semiconductor chip (the input impedance thereof is high) along the Y-direction provide effective countermeasures against noise. The countermeasures exhibit remarkable effects for the IN terminal of error amplifier circuit 76 and for the FB terminal for feeding the signals from error amplifier circuit 76 back to the IN terminal. When the impedance Z1 seen from the terminal B in the direction S is lower than the impedance Z2 seen from the terminal B in the direction P, the terminal B may be deemed to not be an input terminal of the active device.

The disclosure of Japanese Patent Application No. 2005-097212 filed on Mar. 30, 2005, is incorporated herein.

What is claimed is:

1. A micro electric power converter comprising:
 a magnetic insulator substrate;
 a coil provided across a central portion of the magnetic insulator substrate;
 first terminals and second terminals provided on a perimeter portion of the magnetic insulator substrate;
 a semiconductor chip comprising circuits connected to the first terminals and the second terminals; and
 passive component parts,
 wherein a direction perpendicular to a cross section of a coil of the solenoid is designated as an X-direction in which a magnetic flux density generated by current flowing through the coil is high, and a direction perpendicular to the X-direction is designated as a Y-direction in which the magnetic flux density is low, and
 wherein the first terminals, through which are transmitted signals capable of causing a circuit malfunction under the influence of voltages induced by the magnetic flux, are arranged along the Y-direction; and the second terminals, through which are transmitted signals substantially incapable of causing a circuit malfunction under the influence of voltages induced by the magnetic flux, are arranged along the X-direction.

2. The micro electric power converter according to claim 1, wherein the magnetic insulator substrate comprises a ferrite substrate.

3. The micro electric power converter according to claim 1, wherein voltages of the signals transmitted through the first terminals comprise a power supply voltage of a control circuit, a ground voltage of the control circuit, and voltages of analog signals inputted to and outputted from the control circuit.

4. The micro electric power converter according to claim 1, wherein voltages of the signals transmitted through the second terminals comprise digital signal voltages.

5. A micro electric power converter comprising:
 a magnetic insulator substrate;
 a coil provided across a central portion of the magnetic insulator substrate;
 first terminals and second terminals provided on a perimeter portion of the magnetic insulator substrate;
 a semiconductor chip comprising circuits connected to the first terminals and the second terminals on one side of the magnetic insulator substrate; and
 a printed circuit board connected to the first terminals and the second terminals on the magnetic insulator substrate, the printed circuit board comprising passive component parts mounted thereon;
 wherein a direction perpendicular to a cross section of a coil of the solenoid is designated as an X-direction in which a magnetic flux density generated by current flowing through the coil is high, and a direction perpendicular to the X-direction is designated as a Y-direction in which the magnetic flux density is low, and
 wherein the first terminals are arranged along the Y-direction when an impedance seen therefrom in the direction of the semiconductor chip is higher than the impedance seen therefrom in the direction of the printed circuit board, and the second terminals are arranged along the X-direction when the impedance seen therefrom in the direction of the semiconductor chip is lower than the impedance seen therefrom in the direction of the printed circuit board.

6. The micro electric power converter according to claim 5, wherein at least a portion of the first terminals transmits signals capable of causing a circuit malfunction under the influence of voltages induced by the magnetic flux.

* * * * *